US012628544B2

(12) United States Patent　(10) Patent No.: US 12,628,544 B2
Manceau et al.　(45) Date of Patent: May 12, 2026

(54) METHOD FOR MANUFACTURING A LAYER OF MULTI-CATION PEROVSKITE TO FORM PHOTO-ACTIVE LAYER INVOLVING SLOT DIE COATING OR A BLADE COATING OF WET FILM, AND SWEEPING OF THE WET FILM BY FLOW OF DRY AIR OR INERT GAS HAVING SPECIFIED SPEED, AND APPLICATION OF HEAT TREATMENT TO SUBSTRATE

(71) Applicant: COMMISSARIAT À L'ENERGIE ATOMIQUE ET AUX ÉNERGIES ALTERNATIVES, Paris (FR)

(72) Inventors: Matthieu Manceau, Grenoble (FR);
Noëlla Lemaitre, Grenoble (FR);
Stéphane Cros, Grenoble (FR);
Mathilde Fievez, Grenoble (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 451 days.

(21) Appl. No.: 18/305,042

(22) Filed: Apr. 21, 2023

(65) Prior Publication Data

US 2023/0345805 A1　Oct. 26, 2023

(30) Foreign Application Priority Data

Apr. 21, 2022　(FR) ...................................... 22/03721

(51) Int. Cl.
*H10K 30/50*　(2023.01)
*C23C 18/02*　(2006.01)
(Continued)

(52) U.S. Cl.
CPC ............. *H10K 71/15* (2023.02); *C23C 18/02* (2013.01); *H01G 9/0029* (2013.01); *H01G 9/20* (2013.01);
(Continued)

(58) Field of Classification Search
CPC ........ H10K 71/15; H10K 30/50; H10K 85/30; H10K 85/6572; C23C 18/02; H01G 9/0029; H01G 9/20; C30B 7/02; C30B 29/12
See application file for complete search history.

(56) References Cited

FOREIGN PATENT DOCUMENTS

CN　110212098 A * 9/2019 ............... H10K 1/13
WO　WO-2020209916 A2 * 10/2020 ............. H10K 85/50

OTHER PUBLICATIONS

You, Shuai et al. "Long-term stable and highly efficient perovskite solar cells with a formamidinium chloride (FACl) additive". Journal of Materials Chemistry A, vol. 8, No. 34, 2020-09-01, pp. 17756-17764.
(Continued)

*Primary Examiner* — Ermias T Woldegeorgis
(74) *Attorney, Agent, or Firm* — Oliff PLC

(57) ABSTRACT

A method for manufacturing a multi-cation perovskite layer, including: a) supply of a substrate having a deposition face, b) deposition of a precursor solution including precursors comprising CsX, FAY, $PbZ_2$, with X, Y and Z=I, Br, and an FACl additive, the molar ratio of cesium to lead is between approximately 4% and 22%, the molar ratio of FACl relative to lead between 0.1% and 5%, and the perovskite layer has an empirical formula of the type $Cs_xFA_{(1-x+w)}Pb(I_yBr_{(1-y)})_3$ with x between 0.04 and 0.22, y between 0 and 1 and w between 0.001 and 0.05, c) sweeping of the wet film by an inert gas to crystallize the perovskite layer, and heat treat-
(Continued)

ment so that the deposition face has a temperature ranging from about 25° C. to 80° C. C at least during step b).

11 Claims, 5 Drawing Sheets

(51) Int. Cl.

| | |
|---|---|
| *H01G 9/00* | (2006.01) |
| *H01G 9/20* | (2006.01) |
| *H10K 71/15* | (2023.01) |
| *H10K 85/30* | (2023.01) |
| *H10K 85/60* | (2023.01) |

(52) U.S. Cl.
CPC ............. *H10K 30/50* (2023.02); *H10K 85/30* (2023.02); *H10K 85/6572* (2023.02)

(56) References Cited

OTHER PUBLICATIONS

Mori, Tatsuo et al. "Effect of Air-Flow and Solvent Annealing on Fabrication of Perovskite Active Layer and Photovoltaic Properties of Cells with the Active Layer". Journal of Photopolumer Science and Technology, vol. 33, No. 4, Jul. 1, 2020, pp. 399-404.

Le, Thai Son et al. "All-Slot-Die-Coated Inverted Perovskite Solar Cells in Ambient Conditions with Chlorine Additives". Solar RRL, vol. 6, No. 2, Feb. 1, 2022, pp. 2100807 (1-11).

Yu, Fan et al. "Efficient and Stable Wide-Bandgap Perovskite Solar Cells Derived from a Thermodynamic Phase-Pure Intermediate". Solar RRL, vol. 6, No. 2, Feb. 15, 2022, pp. 2100906 (1-7).

Roose, Bart et al. "Critical Assessment of the Use of Excess Lead Iodide in Lead Halide Perovskite Solar Cells". The Journal of Physical Chemistry Letters, 2020, vol. 11, pp. 6505-6512.

Fievez, Mathilde et al. "Slot-die coated methylammonium-free perovskite solar cells with 18% efficiency". Solar Energy Materials & Solar Cells, vol. 230, 2021, p. 111189 (1-9).

Fassl, Paul et al. "Fractional deviations in precursor stoichiometry dictate the properties, performance and stability of perovskite photovoltaic devices". Energy & Environmental Science, vol. 11, No. 12, Dec. 2018, pp. 3325-3542.

Yoo, Jason J. et al. "An interface stabilized perovskite solar cell with high stabilized efficiency and low voltage loss". Energy & Environmental Science, 2019, vol. 12, pp. 2192-2199.

Jiang, Qi et al. "Surface passivation of perovskite film for efficient solar cells". Nature Photonics, vol. 13, Jul. 2019, pp. 460-466.

* cited by examiner

[Fig. 1]
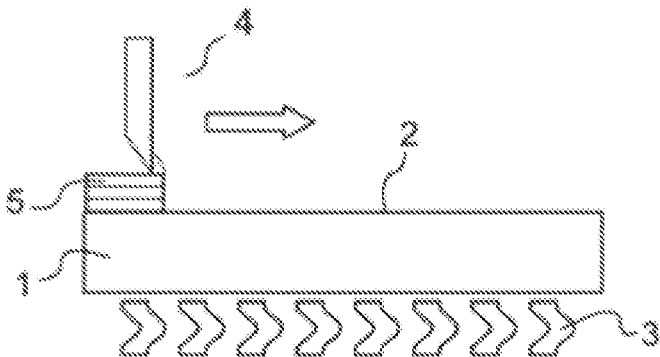
[Fig. 2]
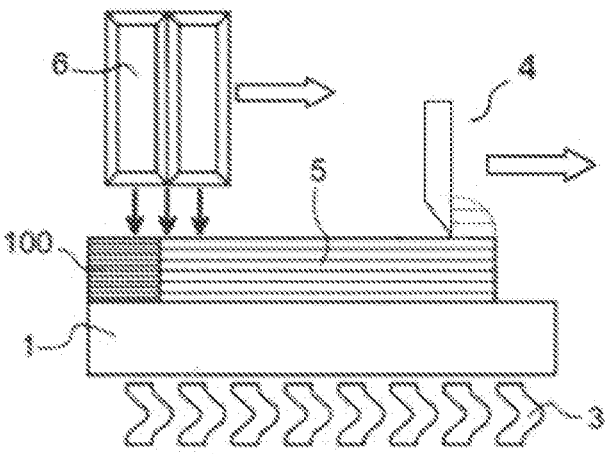
[Fig. 3]
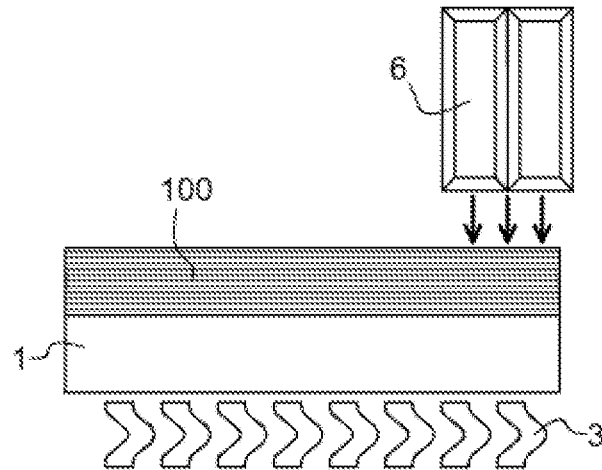

[Fig. 4]
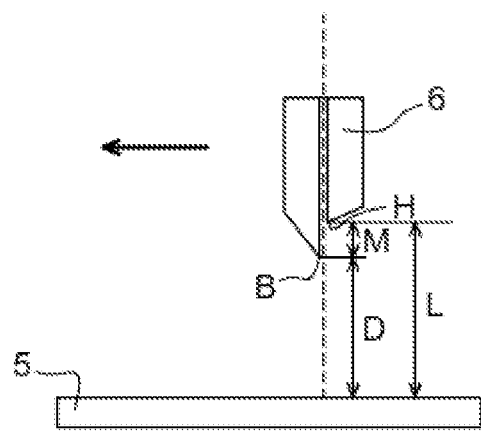
[Fig. 5]
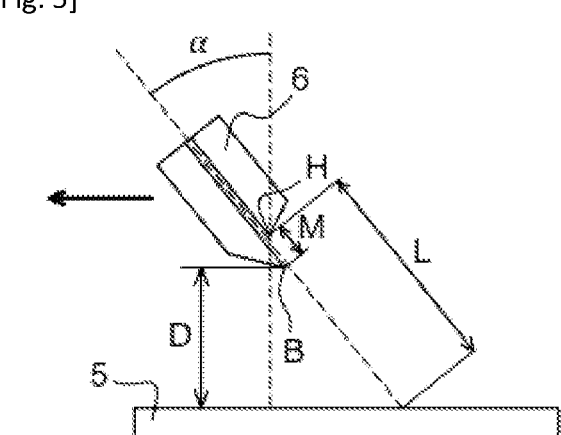
[Fig. 6]
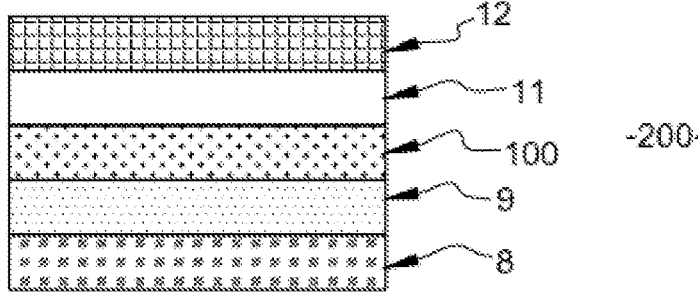

[Fig. 7]
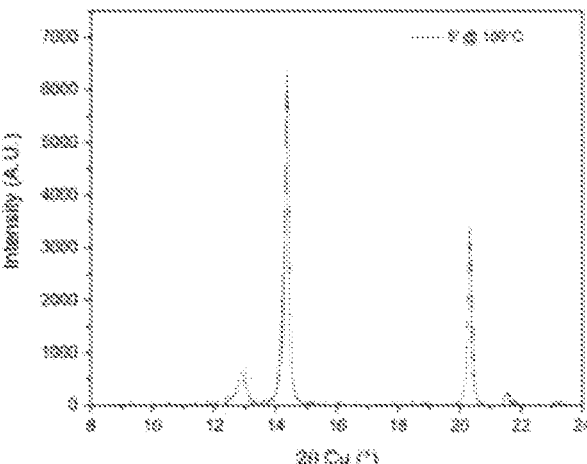
[Fig. 8]
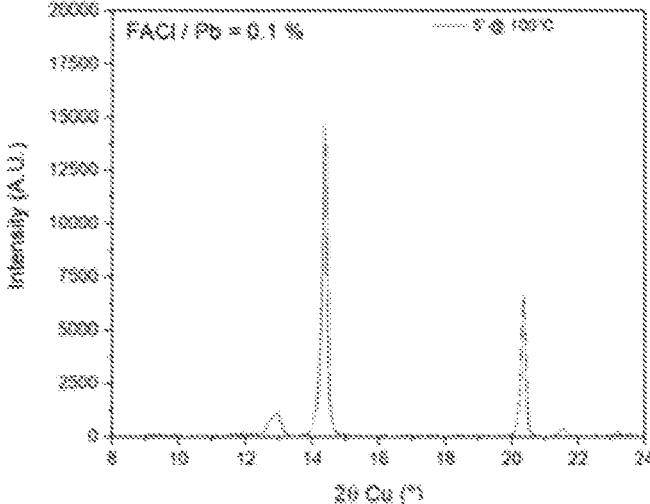

[Fig. 9]
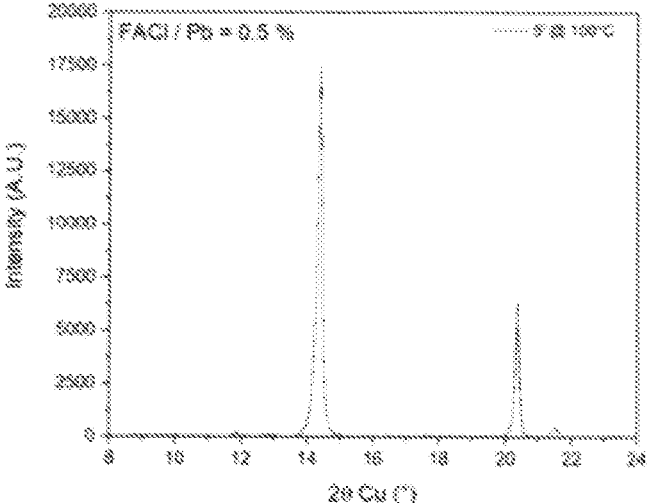
[Fig. 10]
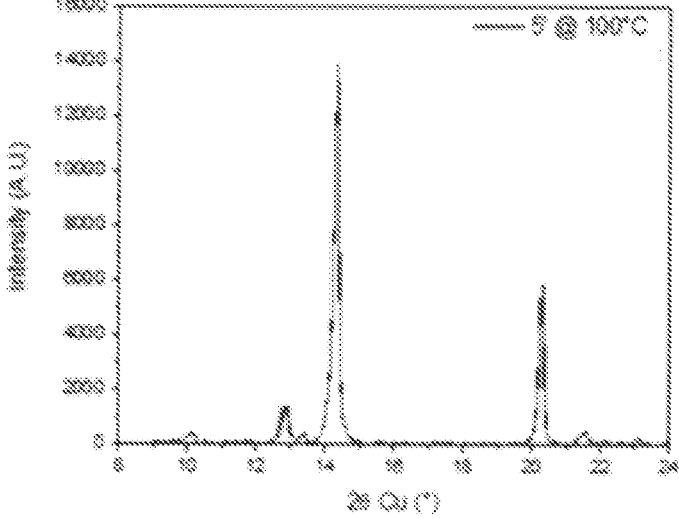

[Fig. 11]
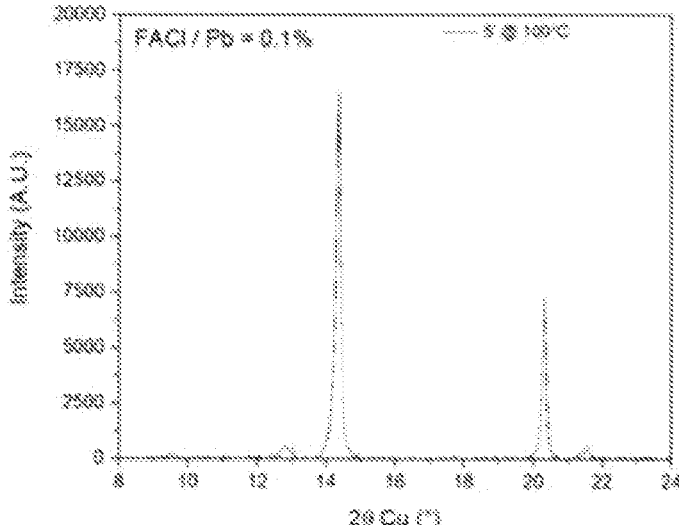
[Fig. 12]
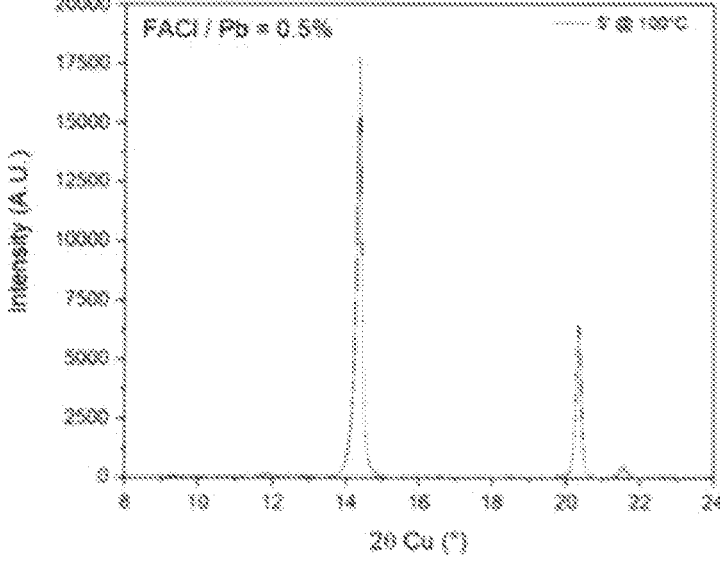

METHOD FOR MANUFACTURING A LAYER OF MULTI-CATION PEROVSKITE TO FORM PHOTO-ACTIVE LAYER INVOLVING SLOT DIE COATING OR A BLADE COATING OF WET FILM, AND SWEEPING OF THE WET FILM BY FLOW OF DRY AIR OR INERT GAS HAVING SPECIFIED SPEED, AND APPLICATION OF HEAT TREATMENT TO SUBSTRATE

The present invention relates to the field of layers of material of the perovskite type for applications in the microelectronics and optoelectronics field. More particularly, the present invention concerns a method for manufacturing a photo-active halogenated hybrid perovskite layer, and in particular a multi-cation perovskite layer, for a use in photovoltaic devices, LEDs, photo-detectors, micro-batteries, or other devices using their semi-conductive properties.

The halogenated hybrid perovskites are promising materials and many developments are being implemented to improve their quality and stability, in particular for the manufacture of solar cells. Indeed, hybrid organic-inorganic lead halide perovskite solar cells showed a remarkable increase in energy conversion efficiency over a relatively short period of time (10 years). Nonetheless, the challenges of this technology are 1) the scaling up of the deposition methods of the different layers, especially the perovskite layer, 2) the stability of the photovoltaic devices under real conditions and 3) the presence of Pb in the absorbent layer of these devices. This invention relates to the first point. Indeed, most of the manufacturing methods that have been developed to date to deposit a perovskite material having physical and optoelectronic properties leading to high photovoltaic performances (>20%) are carried out on a laboratory scale, on small areas. Thus, there remains a need for the design and optimization of methods allowing the manufacture of quality perovskite layers, on an industrial scale, at a reasonable cost and without degradation of their properties.

When a spin coating method is used, the precursors of the target perovskite layer are placed in solution to be spread on a rotating substrate. The projection of an anti-solvent on the rotating substrate makes it possible to initiate the nucleation of the perovskite and thus to obtain covering films of high optoelectronic quality. Nonetheless, when this deposition method is used over a large surface, a non-homogeneous wet film is produced, due to the inhomogeneity of the centrifugal effect. Other deposition methods exist such as blade coating, slot die coating, or inkjet printing, etc., Although these methods are more suitable for depositing a precursor solution on an industrial scale, a major problem lies in the difficulty of obtaining the crystallization of the perovskite film spread on the substrate, whatever the method of formation of the film. The use of the anti-solvent method, based on the centrifugal effect, is not very suitable for large substrates. In addition, this method typically uses a toxic or dangerous solvent (chlorobenzene or toluene) with operators working in glove boxes, an environment not suitable for use on an industrial scale.

Finally, during the implementation under air, desirable for an application on an industrial scale, the obtained devices can present limited performances, in particular in term of Voc.

One of the aims of the present invention is to overcome at least one of these drawbacks. To this end, the invention proposes a method for manufacturing a multi-cation perovskite layer, with a view to form a photo-active layer, the method comprising the steps of:

a) suppling a substrate having a deposition face, b) depositing a precursor solution comprising at least one solvent and perovskite precursors so as to form a wet film on the deposition face, the precursors comprising at least CsX, FAY, $PbZ_2$, with X, Y and Z=I, Br, and an additive of FACl, the amounts being determined such that the molar ratio of cesium relative to lead is comprised between about 4% and 22%, preferably between 13% and 20%, that the molar ratio of FACl relative to lead is comprised between 0.1% and 5%, in particular between 0.1% and 2%, and that the perovskite layer has a molecular formula of the type $CS_xFA_{(1-x+w)}Pb\ (I_yBr_{(1-y)})_3$ with x comprised between 0.04 and 0.22, y comprised between 0 and 1, and w comprised between 0.001 and 0.05, and c) sweeping an exposed surface of the wet film by a flow of dry air or inert gas having a speed greater than or equal to 120 m/s so as to crystallize the multi-cation perovskite layer, the method further comprising the application of a heat treatment to the substrate so that the deposition face has a temperature ranging from about 25° C. to at least 80° C. during step b).

Against all expectation, this combination of parameters relating to the heat treatment applied to the substrate, the composition of the used precursor solution, the presence of a chlorinated additive, the deposition method and the crystallization method, in particular the speed of the gas flow associated with the composition of the precursor solution makes it possible to obtain a perovskite layer of very good crystalline quality, over its entire surface, as can be seen below. In addition, the manufacture of photovoltaic cells using the photo-active perovskite layer thus manufactured gives efficiency results similar to those obtained with a layer deposited by spin coating. Furthermore, the presence of the FACl additive makes it possible to limit or even eliminate the appearance of the $PbI_2$ peak (XRD analyses) following prolonged heat treatment, as conventionally observed, as will be seen in detail in the following description.

In this document, the term «perovskite layer» means a polycrystalline layer of perovskite (alpha phase), as opposed in particular to an amorphous layer or a yellow delta phase and non-absorbent in the desired range. In the present document, the term FA is well known by those skilled in the art in the field of perovskites and designates Formamidinium $HC(NH_2)_2{}^+$.

The perovskite layer obtained at the end of the method is not perfectly stoichiometric. It has already been reported that perovskite exists in «under» or «over-stoichiometric>form, depending on the mode of production, without necessarily affecting its crystalline quality or its absorption properties (see 'Critical Assessment of the Use of Excess Lead Iodide in Lead Halide Perovskite Solar Cells' by Bart Roose et al in *J. Phys. Chem. Lett.* 2020, 11, 16, 6505-6512 or at 'Fractional deviations in precursor stoichiometry dictate the properties, performance and stability of perovskite photovoltaic devices' by Paul Fassl et al. in *Energy Environ. Sci.,* 2018, 11, 3380-3391).

Nonetheless, as already reported on several occasions and in particular by Qi Jiang et al. 'Surface passivation of perovskite film for efficient solar cells' in *Nature Photonics* Volume 13, pages 460-466 (2019), and by Jason J. Yoo et al. 'An interface stabilized perovskite solar cell with high stabilized efficiency and low voltage loss' in Energy & Environmental Science Issue 7, 2019', when using $PbCl_2$ to form MA-based perovskites (and initially $MAPbI_3$), it has been observed in the context of the invention that the chlorine of the FACl additive was not or very little integrated into the crystal lattice of the perovskite layer formed at the end of the method. Some hypotheses put forward mention a possible evaporation during crystallization heat treatment to explain its absence in the obtained perovskite.

Furthermore, the deposition technique used in the method of the invention can be advantageously used on an industrial scale, deposition on a surface of 5×5 cm² has moreover given good results. The powders of the precursor materials used are not unstable and are therefore compatible with an industrial solution. The crystallization according to the invention does not require the application of significant thermal annealing subsequent to step c) of application of gas flow, which reduces the manufacturing costs and possible damage to the crystalline structure. Nevertheless, if such thermal annealing were to be applied, the presence of the FACl additive makes it possible to limit the appearance of crystallized PbI₂ domains, potentially damaging for the yields of the obtained perovskite layer, as will be seen in detail in the following description.

Furthermore, the absorption spectrum of the hybrid perovskites formed by the method of the present invention, having a molecular formula of the type $Cs_xFA_{(1-x+w)}Pb(I_yBr_{(1-y)})_3$ comprising lead, halides and two cations is very interesting and can be modified in particular by adjusting the rate of halides in the composition.

It is also understood by the expression «dry air», compressed air (8 bar) whose dew point is lower than −20° C., and preferably the dew point is lower than −40° C.

According to an arrangement, the exposed surface of the wet film corresponds to the entire exposed face of the wet film so that the entire wet film is swept by the flow of dry air or inert gas.

According to a possibility, the application of a heat treatment to the substrate is carried out so that the deposition face has a temperature ranging between 30° C. and 70° C., and preferably between approximately 40° C. and 60° C. It is in fact interesting to limit the heat treatment applied to the substrate for economic reasons. If the solvent in the wet film is evaporated less easily at 40° C. than at 80° C., it is possible to compensate by increasing the speed of the gas flow.

According to an arrangement, said heat treatment is applied to the substrate so that the deposition face has a temperature ranging from approximately 25° C. to 80° C. during step b) and step c).

According to a variant, the precursors of the perovskite layer are selected from a combination of CsX, FAY and PbZ₂, with X, Y and Z=I, Br, and FACl additive. In other words, in this variant, the solution of precursors is devoid of other precursors or additives than those mentioned in the list above.

According to another possibility, the precursor solution consists of the precursors selected from CsX, FAY, PbZ₂, and any combination thereof, with X, Y and Z selected from I and Br, the FACl additive and at least one solvent. In other words, the precursor solution is devoid of any element other than at least one solvent, the precursors CsX, FAX, PbX₂, and any combination thereof, with X selected from I and Br and the FACl additive. The composition of the precursor solution is thus devoid of any other additive, or of MA⁺ (methylammonium) cation whose presence can alter the stability of the obtained layer.

According to a possibility, the at least one solvent is selected from DMF and/or DMSO. The choice of the composition of the at least one solvent is an important element for facilitating the preparation of the precursor solution by dissolving the precursor elements of the perovskite material and of the FACl additive, and the crystallization which involves the evaporation of said at least one solvent.

According to an arrangement, the precursor solution comprises a molar concentration of lead comprised between 0.5 M and 1.7 M, in particular between 0.6 and 1.5 M and for example between 1 M and 1.3 M.

Preferably, the only thermal budget applied during the manufacturing method is provided by the heat treatment applied to the substrate so that the deposition face has a temperature ranging from approximately 25° C. to 80° C. during steps b) and c). In practice, said heat treatment is applied before step b) of deposition so that the deposition face has the desired temperature when starting the deposition and it is stopped at the end of step c).

According to another possibility, step c) of applying the flow of inert gas or dry air is followed, after obtaining the layer of crystalline perovskite, by a step d) of applying thermal annealing carried out at a temperature comprised between 70° C. and 100° C. The duration of this thermal annealing is comprised between approximately 5 minutes and 60 minutes and according to an arrangement between 5 and 30 minutes. This option can be useful for certain target perovskite empirical formulas, depending on the values of x, y and w of the empirical formula $Cs_xFA_{(1-x+w)}Pb(I_yBr_{(1-y)})_3$, it may be wished to make disappear any minute trace of precursor materials or residual solvent which would not be eliminated in step c). This possible step d) differs from the thermal annealing known in the prior art in particular by its duration.

Nonetheless, prolonged annealing can be applied after step c) without however seeing the appearance of PbI₂ (signal visible by XRD), as generally observed in the absence of FACl. Annealing at 100° C. for a period of 60 min can in particular be carried out under an inert atmosphere. The addition of the FACl additive can make it possible to increase the annealing time range without seeing the perovskite layer degrade.

Preferably, step c) of sweeping with a flow of inert gas or dry air is carried out by relative displacement of the substrate comprising the wet film and of a projection nozzle, such as a projection nozzle of a gas knife, the projection nozzle being arranged such that the length L of the flow path of the inert gas or dry air between the outlet of the projection nozzle and the exposed surface of the wet film is comprised between about 3.1 millimeters and 6 millimeters, and preferably between about 3.1 millimeters and 4 millimeters.

More specifically, the outlet of the projection nozzle is delimited by a low lip and a high lip spaced apart from each other so as to form a space for projecting the flow of inert gas or dry air in an overall blade form, the lower lip defining a low point B and the upper lip defining a high point H. It is understood in this document that the length L of the path of the flow of inert gas or dry air between the outlet of the projection nozzle and the exposed surface of the wet film is measured between the high point H and the exposed surface of the wet film. As will be seen below and with reference to the appended FIGS. 4 and 5, said length L depends on the angle α formed between the wet film and the direction of the flow of inert gas or dry air.

It is understood that the speed of the flow of inert gas or dry air indicated in this document is measured and/or calculated at the outlet of a projection nozzle of a device for spraying said flow. The speed of the flow is a function of the gas flow and the surface of the opening at the exit of the projection nozzle.

In this document, the expression «gas knife» or «air knife» is well known to those skilled in the art.

Preferably, the relative displacement speed between the wet film and the projection nozzle during step c) is comprised between 1 and 50 mm/s and preferably between 5 and 30 mm/s.

According to an arrangement, the angle α formed between the flow of inert gas or dry air and the wet film is comprised between 90° and 45°.

Advantageously, step b) of depositing the precursor solution is carried out by slot die coating or via blade coating, so as to obtain a wet film of constant thickness and of homogeneous concentration. These deposition techniques are in fact used on the large deposition surfaces required in an industrial solution.

In this document, the expression 'slot die coating' is a technique well known to those skilled in the art. In the same way, 'blade coating' is a technique well known to those skilled in the art sometimes also called coating by 'coating blade'.

According to an arrangement, step b) of depositing consists in depositing the precursor solution by a deposition head of the slot die coating device on the deposition face, with a flow rate comprised between 80 and 125 microliter/min for a molar concentration of lead in the precursor solution comprised between 1 M and 1.3 M.

According to a possibility, step b) of depositing the precursor solution is carried out so as to obtain a constant wet film thickness, comprised between 2 and 16 micrometers, preferably between 2.5 and 8 micrometers and more preferably between 3 and 5 micrometers.

These wet film thickness ranges guarantee that it is possible in step c) to obtain crystallization of the perovskite layer with good quality and good yield. These thicknesses of course depend on the concentration of the precursor solution to obtain a crystalline perovskite layer with a thickness in a range of approximately 350-600 nm.

In order to reduce the thermal budget applied to steps b) and c) while maintaining good crystallization of the perovskite layer, it is possible to limit the sweeping speed of the film by the projection nozzle.

Another lever consists in modifying the concentration in the precursor solution, within the ranges indicated above.

It is also possible to be placed in a low part of the range of the length L of the trajectory of the gas flow. In practice, the projection nozzle is brought closer to the exposed surface of the wet film, with a vertical distance D between 100 to 400 micrometers for example.

Another option is to choose a speed of the flow of inert gas or dry air among the fastest of the possibilities offered by the projection nozzle, for example from 135 m/s to 250 m/s.

According to other characteristics, the manufacturing method of the invention comprises one or more of the following optional characteristics considered alone or in combination:

The relative speed between the deposition face and the deposition head (case of slot die coating) of the precursor solution or of the spreading blade (case of blade coating) is comprised between approximately 1 and 100 mm/s and preferably between 15 and 45 mm/s and more preferably between about 20 and 30 mm/s.

The application of the flow of inert gas or dry air according to step c) is carried out on the exposed surface of the wet film before the end of the deposition of the precursor solution according to step b).

The application of the flow of inert gas or dry air according to step c) is carried out on the exposed surface of the wet film after the end of the deposition of the precursor solution according to step b).

The relative speed between the deposition head or the precursor solution spreading blade and the deposition face is similar to the relative speed between the wet film and the inert gas or dry air flow projection nozzle.

The relative speed between the deposition head or the spreading blade and the deposition face is greater than the relative speed between the wet film and the inert gas or dry air flow projection nozzle.

The relative speed between the deposition head or the spreading blade and the deposition face is lower than the relative speed between the wet film and the inert gas or dry air flow projection nozzle.

The displacement between the deposition face and the deposition head (or the spreading blade) and the movement between the exposed surface of the wet film and the projection nozzle consists of translational movement, in the direction of longitudinal extension of the deposition face.

The flow of dry air or inert gas is distributed from a source of compressed gas. It is projected onto the exposed surface of the wet film at a temperature about 15° C. to 25° C. without an intermediate reheating step.

The flow of dry air or inert gas has a speed comprised between 120 m/s and 250 m/s during step c).

The vertical distance D between the exposed surface of the wet film and the point B of the outlet of the projection nozzle is comprised between 100 micrometers and 1 mm and preferably between 200 and 400 micrometers.

The projection nozzle has no flattening so that M=0 and the low point B and the high point H are at the same vertical distance D from the exposed surface of the wet film.

The heat treatment of the substrate is carried out by placing the substrate on a dedicated heating platform, so that the support is heated through a face opposite to the deposition face of the wet film.

The heat treatment is stopped at the end of step b).

The precursor solution deposition head is placed at a distance, measured plumb with the deposition face, comprised between 25 and 500 micrometers and preferably between approximately 80 and 125 micrometers, and more preferably approximately 100 micrometers.

The distance between the spreading blade during blade coating and the deposition face is comprised between 25 and 200 micrometers and in particular between 50 and 100 micrometers.

Steps a) to c) and the heat treatment are carried out in a clean room enclosure having a temperature comprised between 20 and 35° C.

Steps a) to c) and the heat treatment are carried out in a clean room enclosure with a relative humidity level comprised between 8 and 38%.

The clean room has a temperature about 21° C. and a relative humidity about 35%.

The perovskite layer obtained in step c) has a thickness about 500 nanometers.

The manufacturing method does not require an anti-solvent treatment to convert the wet film into a crystalline film.

The substrate used for the deposition is a wafer-type substrate of a few hundred micrometers, for example made of silicon or glass, or else a thin and flexible substrate in a rolled-up form. In the latter case, the substrate is driven by a translational movement leading to its unwinding and its displacement under the immobile slot die coating or blade coating device, and under the inert gas or dry air flow projection nozzle also immobile.

The invention will be better understood on reading the non-limiting description which follows, made with reference to the appended figures.

FIG. 1 is a schematic view illustrating steps a) to b) of an embodiment of the method of the invention.

FIG. 2 is a schematic view illustrating steps b) and c) of the method of the invention.

FIG. 3 is a schematic view illustrating step c) of the method of the invention.

FIG. 4 is a schematic view of the outlet of a gas flow projection nozzle according to step c) of the method of the invention.

FIG. 5 is a schematic view of an inclined projection nozzle according to step c) of the method of the invention.

FIG. 6 is a schematic view of an architecture of the structure for a NIP-type solar cell formed from a layer of perovskite 100 manufactured according to an embodiment of the method of the invention.

FIG. 7 is a view of an X-ray diffraction (XRD) analysis of the structure for NIP type solar cell without FACl additive.

FIG. 8 is an XRD view of the structure for a NIP-type solar cell comprising a 0.1% molar ratio of FACl relative to lead according to one embodiment of the method of the invention.

FIG. 9 is a view of an XRD analysis of the structure for a NIP-type solar cell comprising a 0.5% molar ratio of FACl relative to lead according to one embodiment of the method of the invention.

FIG. 10 is a view of a XRD analysis of the structure for PIN-type solar cell without FACl additive.

FIG. 11 is a view of an XRD analysis of the structure for a PIN-type solar cell comprising a 0.1% molar ratio of FACl relative to lead according to one embodiment of the method of the invention.

FIG. 12 is a view of an XRD analysis of the structure for a PIN-type solar cell comprising a 0.5% molar ratio of FACl relative to lead according to one embodiment of the method of the invention.

In the following examples, the $PbI_2$ used is 99.99% pure and comes from TCI Chemicals (Japan), the $PbBr_2$, FAI, CsI, FACl, DMF and DMSO come from Sigma Aldrich.

The used gas knife is the Silent X-Stream Air Blade equipment, available from AirFlow supplier.

The slot die coating is carried out using the Automatic-Research TFC 300 equipment.

The blade coating is carried out using a Zehntner ZUA 2000 deposition blade.

In these examples described below, the substrate 1 and the deposition face 2 are immobile but according to a particular arrangement, the substrate 1 and therefore the deposition face 2 moves while the device for depositing the wet film (blade coating) and the gas flow projection device (gas knife) are immobile (case of the flexible substrate in rolled form).

First Example Embodiment of the Method for Manufacturing a Layer of Crystalline Perovskite 100 According to the Invention by Blade Coating:

The steps of the method are illustrated in FIGS. 1 to 3. FIG. 1 illustrates step a) of the method consisting in supplying a substrate 1 including a deposition face 2 on a heating platform 3 in a controlled-atmosphere enclosure (temperature about 21° C. and a relative humidity about 20%). Within the framework of the preparation of photovoltaic devices, the substrate 1 used is a structure (5 cm×5 cm) consisting of a glass support 7 (thickness 1.1 mm), covered with a layer of ITO 8 (layer of indium and tin oxide with a thickness about 220 nm) itself covered with a layer of $SnO_2$ 9 (tin oxide) prepared with a view to manufacture a NIP-type solar cell (illustrated in FIG. 6). Typically, the $SnO_2$ layer was deposited beforehand by spin coating or slot-die coating then dried at 80° C. for one minute. It has a thickness about 50 nm and its roughness is about 5 nm.

A substrate 1 consisting of a PIN type solar cell structure can also be used, as can a substrate 1 making it possible to manufacture a tandem type structure using silicon. In the case of a PIN-type architecture, a self-assembled monolayer of 2-Pacz (or [2-(9H-Carbazol-9-yl)ethyl] phosphonic Acid supplied by the company TCI America-CAS number: 20999-38-6) forms the holes extracting layer 11. This layer 11 is deposited by spin-coating on the ITO glass substrate previously treated with UV-ozone.

A heat treatment is applied via the heating platform 3 to the substrate 1 through the face opposite the deposition face 2. This heat treatment is controlled so that the temperature of the deposition face 2 of the substrate 1 is maintained at approximately 40° C.

A precursor solution is prepared from the following quantities of precursors $PbI_2$, (3.707 g), $PbBr_2$ (1.453 g), FAI (1.631 g), CsI (0.468 g) and the FACl additive (9.7 mg), dissolved in 12 ml of a solvent mixture consisting of 10.8 ml of DMF and a 1.2 ml of DMSO. The concentration of Pb in the solution is about 1 M, the molar ratio of Cs to Pb is about 15% and the molar ratio of FACl to Pb is about 0.1%.

After stirring the precursor solution at 40° C. for approximately 12 hours, the deposition is carried out by a 'blade coating' device on a deposition face 2 of the substrate 1 having a temperature about 40° C. The distance between the spreading blade 4 of the blade coating device and the deposition face 2 of the substrate 1 is approximately 70 micrometers. The relative speed between the deposition face 2 and the spreading blade 4 is 20 mm/s and the volume of ink used is 20 microliters. The nitrogen flow is applied to the exposed surface of the wet film 5 with a speed about 137 m/s. The nitrogen flow projection nozzle 6 is arranged so that the length L of the gas flow path is approximately 3.6 mm. The nozzle 6 moves at a speed of 5 mm/s.

The projection nozzle 6 is oriented so that the nitrogen flow is sprayed by forming an angle $\alpha$ of 50° with the exposed surface of the wet film 5. According to a step d) (not shown) of the method, a heat treatment for a duration of 5 minutes at a temperature of 100° C. under an inert atmosphere is carried out after the passage of the projection nozzle. A layer of crystalline perovskite 100 with the molecular formula $CS_{0.15}FA_{0.79}Pb_{(0.78}Br_{0.22)2.94}$ is obtained with high quality (the precision concerning the values of the molecular formula is limited to two decimal places).

Extended annealing tests were also carried out, with a total annealing time of 60 minutes at 100° C., still under an inert atmosphere.

Second Example Embodiment of the Method for Manufacturing a Layer of Crystalline Perovskite 100 According to the Invention by Blade Coating:

In this second example, the precursor solution has the following quantities of precursors $PbI_2$, (3.707 g), $PbBr_2$ (1.453 g), FAI (1.631 g), CsI (0.468 g) and FACl (48.3 mg) dissolved in 12 ml of a mixture consisting of 10.8 ml of DMF and 1.2 ml of DMSO. The concentration of Pb in the solution is about 1 M, the molar ratio of Cs to Pb is about 15% and the molar ratio of FACl to Pb is about 0.5%.

The other parameters described for the first example embodiment are identical for this second example embodiment.

Although this is not described in the examples, the deposition of the precursor solution by slot die coating is a possible deposition route.

Analyzes and Measurements Carried Out from the Layers of Perovskites Formed According to the Manufacturing Method of the Invention:

Different layers of perovskite 100 were fabricated by a blade coating device for FACl/Pb molar ratios of 0.1 and 0.5% in NIP architecture (FIGS. 8 and 9) and PIN architecture (FIGS. 11 and 12) (the other elements remaining unchanged). The same analyzes were also carried out on layers prepared from a precursor solution not containing the FACl additive, and therefore serve as a reference (FIG. 7 for the NIP and FIG. 10 for the PIN).

The XRD (acronym for X-Ray Diffraction) analyzes of the formed layers show that a layer of polycrystalline perovskite 100 (alpha phase, or so-called black phase) is indeed present whether at 0.1 or 0.5% molar ratio of FACl with a total absence of a delta phase (or so-called yellow phase, which is not desired).

Moreover, a rate of 0.5% of the FACl additive makes it possible to limit or even eliminate the appearance of the signal relating to $PbI_2$ (between 12.5° and 13°) whether in NIP or PIN architecture (refer to FIG. 9 or 12) while this signal is indeed present for the reference solution (FIG. 7 or 10) and for the solution comprising an FACl/Pb molar ratio of 0.1%, the $PbI_2$ peak is moreover increased with an extended annealing 60 minutes at 100° C. (not shown). Interestingly, for this FACl level of 0.5%, the peak relating to $PbI_2$ is also not observed after prolonged annealing (total duration of 60 minutes—not shown).

Implementation of the Perovskite Layers Prepared According to the Invention in Solar Cells:

So Called N-I-P Configuration:

The perovskite 100 layers prepared as previously described are deposited on substrates 1 comprising a glass support 7, an ITO layer 8 (transparent electrode)/a $SnO_2$ layer 9 (electron extracting layer) in a square shape of 5 cm×5 cm. In order to complete the manufacture of the device, a holes extracting layer 11 of doped PTAA is deposited by spin coating on the perovskite layer 100, then an upper gold electrode 12 is evaporated in surface (refer to the stack in FIG. 6).

So Called P-I-N Configuration:

In this other configuration, the perovskite layers prepared as previously described above are deposited on substrates comprising a glass support, a layer of ITO (transparent electrode)/a self-assembled monolayer of 2-PACz (or [2-(9H-Carbazol-9-yl)ethyl] phosphonic Acid supplied by the company TCI America-CAS number: 20999-38-6) forming the holes extracting layer, in the square shape of 5 cm×5 cm. In order to complete the manufacture of the device, an electron extracting layer of $C_{60}$ then a layer of BCP (or Bathocuproine, derivative of 1,10-phenanthroline, supplied by Sigma Aldrich-CAS number 4733-39-5) and an upper silver electrode are surface evaporated.

The photovoltaic performances of the 200 solar cells were measured at 25° C. under standard lighting conditions (1000 W.m-2, AM 1.5 G) with a Newport brand solar simulator. Current-voltage curves were recorded using a Keithley. The results are recorded in Table 1 below.

The first line of Table 1 reports the results obtained for a perovskite layer deposited by the Dr Blade method in NIP architecture without the FACl additive and serves as a reference. The results of the first example embodiment of a perovskite layer 100 with additive (Dr Blade coating as previously described) in NIP architecture are recorded in the second line of Table 1. These devices were prepared in the form of modules comprising 8 strips connected in series with a total active area of 10 $cm^2$.

The third line of Table 1 shows the results obtained from cells 200 prepared in PIN architecture without the FACl additive and serves as a reference. The results of producing a layer of perovskite 100 with additive (Dr Blade coating as previously described) in PIN architecture are given in the fourth line of Table 1. These devices were prepared in the form of unit cells with a surface area of 33 $mm^2$.

TABLE 1

| Deposit conditions | $V_{oc}$ (mV) | $J_{sc}$ (mA · cm$^{-2}$) | FF (%) | PCE (%) |
|---|---|---|---|---|
| Deposit by blade coating [2] (1M in Pb-Cs/Pb 15%) NIP Architecture Reference Without Additive | 9280 | 2.54 | 69.4 | 16.4 |
| Deposit by blade coating[2] (1M in Pb-Cs/Pb 15%) NIP Architecture With FACl Additive 0.5% | 9635 | 2.44 | 77.5 | 18.2 |
| Deposit by blade coating[1] (1M in Pb-Cs/Pb 15%) PIN Architecture Reference Without Additive | 1028 | 19.5 | 67.4 | 13.5 |
| Deposit by blade coating[1] (1M in Pb-Cs/Pb 15%) (PIN Architecture With FACl Additive 0.5% | 1073 | 20.8 | 66.2 | 14.8 |

[1]Best result obtained for cells prepared in the form of unit cells with an area of 33 $mm^2$
[2]Best result obtained for cells prepared in the form of modules comprising 8 strips connected in series.

On reading the table, it can be seen that the performance of the solar cells 200 is increased for the perovskite layer obtained with the FACl additive. The presence of the additive makes it possible in particular to significantly improve the Voc whether in NIP or PIN configuration. Thus, the layers of perovskite 100 obtained according to the method of the present invention are of high quality and can be implemented in 5 very efficient perovskite solar cells.

In conclusion, the invention makes it possible to optimize the manufacturing method of a layer of perovskite 100 with multi-cations. It makes it possible to form a quality crystalline layer 100, under conditions suitable for an industrial solution. The integration of these layers in devices of the solar cell type 200 is possible and leads to very good results.

The invention claimed is:

1. A method for manufacturing a layer of perovskite with multi-cations, with a view to form a photo-active layer, the method comprising the steps of:
   a) suppling a substrate having a deposition face,
   b) depositing a precursor solution comprising at least one solvent and perovskite precursors so as to form a wet film on the deposition face, the depositing being carried out by slot die coating or via a blade coating, the precursors comprising at least CsX, FAY, $PbZ_2$, with X, Y and Z=I, Br, and an FACl additive, the amounts being determined such that the molar ratio of cesium to lead is comprised between about 4% and 22%, preferably between 13% and 20%, that the molar ratio of FACl relative to lead is comprised between 0.1% and 5%, in particular between 0.1% and 2%, and that the perovskite layer has a empirical formula of the $Cs_xFA_{(1-x+w)}Pb(I_yBr_{(1-y)})_3$ type with x comprised between 0.04 and 0.22, y comprised between 0 and 1 and w comprised between 0.001 and 0.05, and c) sweeping an exposed surface of the wet film by a flow of dry air or inert gas having a speed greater than or equal to 120 m/s so as to crystallize the multi-cations perovskite layer, the method further comprising the application of a heat treatment to the substrate so that the deposition face has a temperature ranging from about 25° C. to 80° C. at least during step b).

2. The manufacturing method according to claim 1, wherein step c) of sweeping with a flow of inert gas or dry air is carried out by a relative displacement of the substrate comprising the wet film and a projection nozzle, such as a projection nozzle of a gas knife, the projection nozzle being arranged such that the length of the flow path of the inert gas or dry air between the outlet of the projection nozzle and the exposed surface of the wet film is comprised between about 3.1 millimeters and 6 millimeters.

3. The manufacturing method according to claim 2, wherein the speed of relative movement between the wet film and the projection nozzle (6) during step c) is comprised between 1 and 50 mm/s.

4. The manufacturing method according to claim 2, wherein the angle α formed between the flow of inert gas or dry air and the wet film is comprised between 90° and 45°.

5. The manufacturing method according to claim 1, wherein the application of a heat treatment to the substrate is carried out so that the deposition face has a temperature ranging between about 30° C. and 70° C.

6. The manufacturing method according to claim 1, wherein the precursors of the perovskite layer are selected from a combination of CsX, FAY and $PbZ_2$, with X, Y and Z=I, Br and the FACl additive.

7. The manufacturing method according to claim 1, wherein the at least one solvent is selected from DMF and/or DMSO.

8. The manufacturing method according to claim 1, wherein the molar concentration of lead in the precursor solution is comprised between 0.5 M and 1.7 M.

9. The manufacturing method according to claim 1, wherein the only thermal budget applied during the manufacturing method is provided by the heat treatment applied to the substrate so that the deposition face has a temperature ranging from about 25° C. to 80° C. during steps b) and c).

10. The manufacturing method according to claim 1, wherein step c) of applying the flow of inert gas or dry air is followed by a step d) of applying a thermal annealing carried out at a temperature comprised between 70° C. and 100° C.

11. The manufacturing method according to claim 1, wherein step b) of depositing the precursor solution is carried out so as to obtain a constant wet film thickness comprised between 2 and 16 micrometers.

* * * * *